(12) United States Patent
Oh

(10) Patent No.: US 11,138,919 B2
(45) Date of Patent: Oct. 5, 2021

(54) DISPLAY APPARATUS HAVING RELIABLE PADS

(71) Applicant: Samsung Display Co., Ltd., Yongin-si (KR)

(72) Inventor: Hyunuk Oh, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/844,097

(22) Filed: Apr. 9, 2020

(65) Prior Publication Data

US 2020/0242999 A1 Jul. 30, 2020

Related U.S. Application Data

(63) Continuation of application No. 15/479,515, filed on Apr. 5, 2017, now Pat. No. 10,650,720.

(30) Foreign Application Priority Data

Apr. 5, 2016 (KR) .................. 10-2016-0041718

(51) Int. Cl.
| | |
|---|---|
| *G09G 3/00* | (2006.01) |
| *G09G 3/20* | (2006.01) |
| *G09G 3/36* | (2006.01) |
| *G09G 3/3233* | (2016.01) |
| *H01L 27/32* | (2006.01) |

(52) U.S. Cl.
CPC ......... *G09G 3/2092* (2013.01); *G09G 3/3233* (2013.01); *G09G 3/3648* (2013.01); *G09G 3/3696* (2013.01); *G09G 2300/0426* (2013.01); *G09G 2300/0809* (2013.01); *G09G 2300/0842* (2013.01); *G09G 2330/028* (2013.01); *G09G 2330/04* (2013.01); *H01L 27/3276* (2013.01)

(58) Field of Classification Search
CPC ............... G02F 1/1345; G02F 1/13452; G02F 1/13458; G09G 2310/0286; G09G 2310/0267

See application file for complete search history.

(56) References Cited

U.S. PATENT DOCUMENTS

| | | | |
|---|---|---|---|
| 6,184,966 B1 | 2/2001 | Fujita et al. | |
| 6,747,724 B2 | 6/2004 | Onaka et al. | |
| 6,774,969 B2 | 8/2004 | Ma et al. | |
| 2003/0189542 A1 | 10/2003 | Lee et al. | |
| 2004/0246215 A1* | 12/2004 | Yoo | ................ G09G 3/3688 345/87 |
| 2006/0290390 A1* | 12/2006 | Jang | ................ G11C 19/28 327/112 |

(Continued)

FOREIGN PATENT DOCUMENTS

| | | |
|---|---|---|
| KR | 10-1998-0045382 | 10/1998 |
| KR | 10-2002-0004612 | 1/2002 |

(Continued)

*Primary Examiner* — Yuzhen Shen

(74) *Attorney, Agent, or Firm* — Kile Park Reed & Houtteman PLLC

(57) ABSTRACT

A display apparatus includes a first signal pad and a second signal pad on a substrate. The first signal pad receives a first voltage. The second signal pad receives a second voltage less than the first voltage. The at least one conductive pad is between the first signal pad and the second signal pad and receives an alternating current voltage.

15 Claims, 13 Drawing Sheets

(56) References Cited

U.S. PATENT DOCUMENTS

| | | |
|---|---|---|
| 2008/0030494 A1 | 2/2008 | Woo et al. |
| 2008/0231617 A1 | 9/2008 | Miyake et al. |
| 2009/0002357 A1 | 1/2009 | John et al. |
| 2010/0110047 A1 | 5/2010 | Yoon et al. |
| 2010/0219853 A1* | 9/2010 | Cho ........................ G09G 3/006 |
| | | 324/760.01 |
| 2010/0309173 A1 | 12/2010 | Matsuda et al. |
| 2011/0157129 A1* | 6/2011 | Song ................... G09G 3/3685 |
| | | 345/211 |
| 2012/0176417 A1 | 7/2012 | Jang et al. |
| 2014/0062983 A1* | 3/2014 | Kim ..................... G09G 3/3696 |
| | | 345/211 |
| 2014/0321599 A1* | 10/2014 | Cho ........................ G11C 19/28 |
| | | 377/64 |
| 2015/0002382 A1 | 1/2015 | Cao |
| 2015/0138180 A1* | 5/2015 | Park ..................... G09G 3/3233 |
| | | 345/212 |
| 2015/0303314 A1 | 10/2015 | Yun |

FOREIGN PATENT DOCUMENTS

| | | |
|---|---|---|
| KR | 10-0302577 | 7/2002 |
| KR | 10-0500186 | 7/2005 |
| KR | 10-0839149 | 6/2008 |

\* cited by examiner

DISPLAY APPARATUS HAVING RELIABLE PADS

CROSS-REFERENCE TO RELATED APPLICATION(S)

This is a continuation application based on U.S. patent application Ser. No. 15/479,515, filed Apr. 5, 2017 (now U.S. Pat. No. 10,560,720), the disclosure of which is incorporated herein by reference in its entirety. U.S. patent application Ser. No. 15/479,515 claims priority benefit of Korean Patent Application No. 10-2016-0041718 under 35 U.S.C. § 119, filed on Apr. 5, 2016, the disclosure of which is incorporated herein by reference in its entirety for all purposes.

BACKGROUND

1. Field

One or more embodiments relate to a display apparatus.

2. Description of the Related Art

Exposed portions of pads arranged on a substrate of a display apparatus may chemically react with moisture or contaminants and may corrode. Furthermore, the pads may be corroded due to electrolysis based on voltage differences between pads adjacent to one another. As a result, wires connected to the pads may also corrode, and thus the display apparatus may not be normally driven.

SUMMARY

In accordance with one or more embodiments, a display apparatus includes a substrate; a first signal pad, on the substrate, to receive a first voltage; a second signal pad, on the substrate, to receive a second voltage less than the first voltage; and at least one conductive pad between the first signal pad and the second signal pad, the at least one conductive pad to receive an alternating current (AC) voltage. A high-level voltage of the AC voltage may be the first voltage, and a low-level voltage of the AC voltage may be the second voltage.

At least one of the high-level voltage or the low-level voltage of the AC voltage may be between the first voltage and the second voltage. A high voltage maintaining period of the AC voltage may be different from a low voltage maintaining period of the AC voltage. The high voltage maintaining period of the AC voltage may be longer than the low voltage maintaining period of the AC voltage. The at least one conductive pad may include at least two conductive pads to receive an AC voltage including high-level voltage corresponding to the first voltage and low-level voltage corresponding to the second voltage, the at least two conductive pads in parallel, and rising and falling times of the AC voltages for the at least two conductive pads may be equal to each other.

The at least one conductive pad may include a first conductive pad, adjacent to the first signal pad, to receive a first AC voltage; and a second conductive pad, adjacent to the second signal pad, to receive a second AC voltage. The high-level voltage and the low-level voltage of the first AC voltage may be equal to the high-level voltage and the low-level voltage of the second AC voltage, and the rising time and the falling time of the first AC voltage may be equal to those of the second AC voltage.

A high voltage maintaining period of the first AC voltage may be different from a high voltage maintaining period of the second AC voltage. The high voltage maintaining period of the first AC voltage may be longer than the high voltage maintaining period of the second AC voltage. A frequency of the first AC voltage may be different from a frequency of the second AC voltage.

The high-level voltage of the first AC voltage may be the first voltage and the low-level voltage of the first AC voltage may be a third voltage between the first voltage and the second voltage, the high-level voltage of the second AC voltage may be a fourth voltage between the first voltage and the second voltage and the low-level voltage of the second AC voltage may be the second voltage, and the third voltage may be equal to or greater than the fourth voltage.

The at least one conductive pad may include a third conductive pad, between the first conductive pad and the second conductive pad, to receive an AC voltage including high-level voltage corresponding to the first voltage and low-level voltage corresponding to the second voltage.

The display apparatus may include a voltage generator to output the first voltage and the second voltage respectively to the first signal pad and the second signal pad and to output the AC voltage to the at least one conductive pad. The voltage generator may control at least one of high-level voltage, low-level voltage, a high voltage maintaining period, a low voltage maintaining period, or a frequency of the AC voltage. The voltage generator may independently control amplitudes, cycles, and frequencies of a first AC voltage input to a first conductive pad adjacent to the first signal pad and a second AC voltage input to a second conductive pad adjacent to the second signal pad.

The display apparatus may include a plurality of pixels on the substrate; and a driver to output driving signals to the pixels. The display apparatus may include a clock line to input a clock signal to the driver, wherein the at least one conductive pad is connected to the clock line. At least one of the first signal pad or the second signal pad may be connected to an input line, that is to input a signal to the driver. At least one of the first signal pad or the second signal pad may be connected to a power line, that is to supply power voltages to the pixels.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
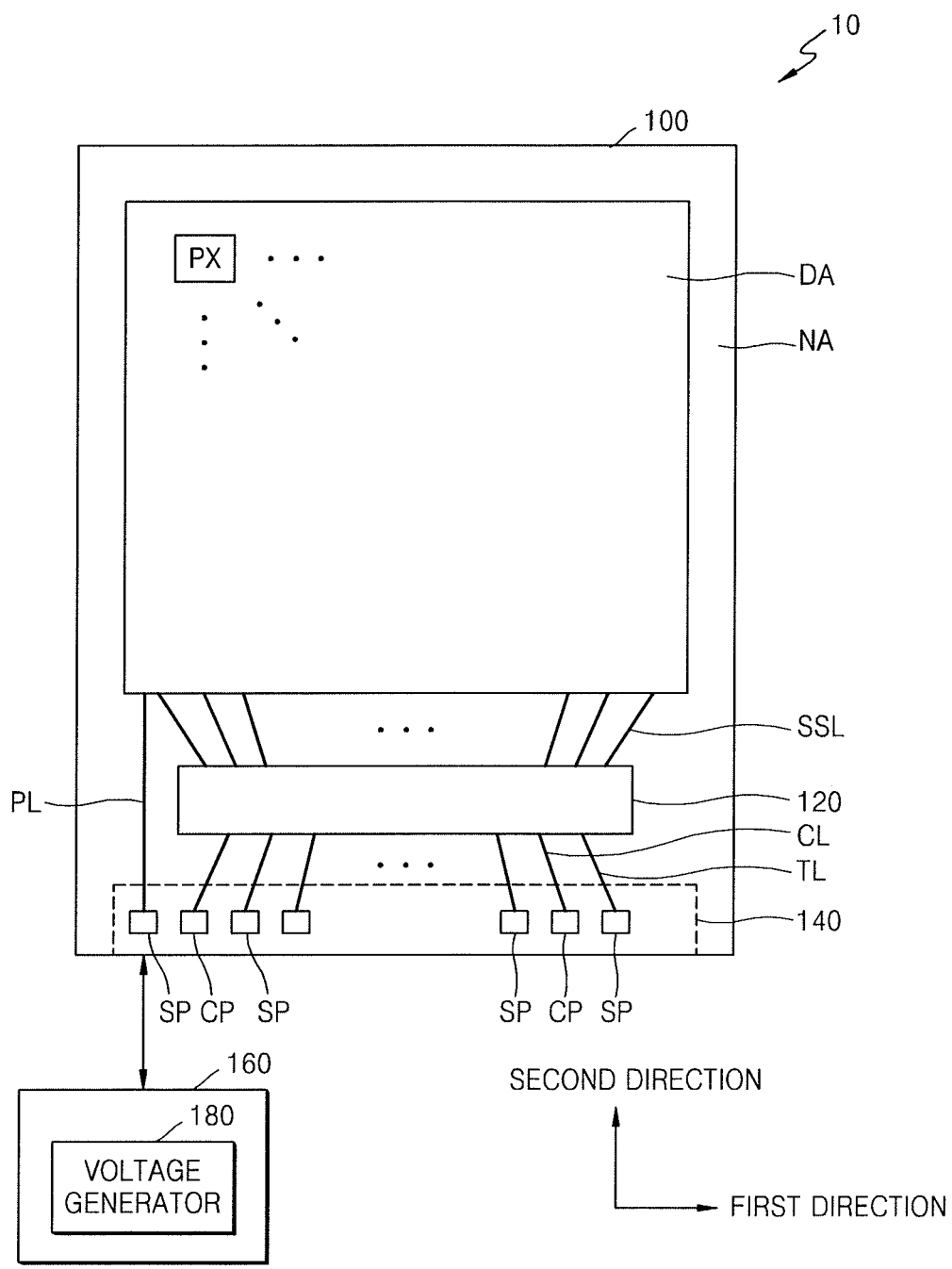
FIG. 1 illustrates an embodiment of a display apparatus.

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey exemplary implementations to those skilled in the art. The embodiments (or portions thereof) may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

FIG. 1 illustrates an embodiment of a display apparatus 10 which includes a substrate 100, a plurality of pixels PX in a display area DA of the substrate 100, and a driver 120 and an arrangement of pads 140 in a non-display area NA around the display area DA.

In the display area DA, each pixel PX is connected to a data line and a scan line, receives a scan signal from the scan line and a data line from the data line, and emits light of a certain color. In the display area DA, scan lines may extend in a first direction or a second direction crossing the first direction, and data lines may extend in the second direction or the first direction.

The driver 120 may be connected to a plurality of signal lines SSL in the display area DA, e.g., a plurality of scan lines and a plurality of data lines. The driver 120 may include a scan driver that generates and outputs scan signals to the scan lines and/or a data driver that generates and outputs data signals to the data lines. The driver 120 may be mounted on substrate 100 using, for example, a on chip-on-glass (COG) technique.

The arrangement of pads 140 includes a plurality of signal pads SP to transfer power voltages and/or signals (supplied from one or more external sources) to the pixels PX in the display area DA and/or the driver 120. The signal pad SP may be connected to a transfer line TL and may transfer a signal input to the signal pad SP to the transfer line TL. The transfer line TL may transfer a signal to the driver 120. The transfer line TL may include a power line PL that transfers a power voltage input to the signal pad SP.

The signal pads SP may include a high-voltage pad for receiving a high voltage and a low-voltage pad for receiving a low voltage. A high voltage and a low voltage may be relative values. For example, a signal pad SP that receives a relatively high voltage may be a high-voltage pad, and a signal pad SP that receives a relatively low voltage may be a low-voltage pad. In another example, a high voltage may be a positive voltage, and a low voltage may be a negative voltage. For example, the positive voltage may be a voltage identical to or higher than 1 V, and the negative voltage may be a voltage below or identical to 0 V. The positive and negative voltages may be different values in another embodiment.

At least one conductive pad CP may be between a high-voltage pad and a low-voltage pad. The conductive pad CP may be connected to a conductive line CL. The conductive line CL may be spaced a certain distance from the transfer line TL and may be parallel to the transfer line TL. The conductive pad CP may receive an alternating current (AC) voltage, e.g., the AC current may alternate between high-level and low-level voltages. The high-level voltage may be, for example, identical to a high voltage or a voltage between a high voltage and a low voltage. The low-level voltage may be, for example, identical to a low voltage or a voltage between a high voltage and a low voltage. In another example, the conductive pad CP may receive a direct current (DC) voltage between a high voltage and a low voltage.

The signal pad SP and the conductive pad CP may include a transparent conductive film, which, for example, may include indium tin oxide (ITO) and indium zinc oxide (IZO), metal, such as aluminum and silver, or an alloy including metal. In another embodiment, the signal pad SP and/or the conductive pad CP may include other conductive materials having corrosion resistance.

The locations and numbers of lines interconnecting the pads 140 and the components of the display apparatus 10 in FIG. 1 are merely examples, and thus may be different in other embodiments. Also, the signal pads SP and the conductive pads CP are disposed in a single line in FIG. 1. In another embodiment, the signal pads SP and the conductive pads CP may be a different pattern, e.g., a zigzag shape.

The arrangement of pads 140 may be electrically and physically connected to a controller 160. The controller 160 may be, for example, in an integrated circuit chip bonded to a flexible printed circuit board FPC and connected to the pads 140 via the flexible printed circuit board FPC. The controller 160 may include a voltage generator 180, which may include a circuit element that generates and outputs at least one power voltage and at least one driving signal for generating a scan signal and a data signal. A driving signal and power voltage output by the voltage generator 180 may be input to the signal pad SP. The voltage generator 180 may generate an AC voltage or a DC voltage and output the AC voltage or the DC voltage to the conductive pad CP. The AC voltage or the DC voltage may include a driving signal and a power voltage input to the signal pad SP.

The display apparatus 10 may be any one of a number of display apparatuses, including but not limited to an organic light-emitting display apparatus, a liquid crystal display (LCD) apparatus, and a field emission display (FED) apparatus.

Figure 2A:
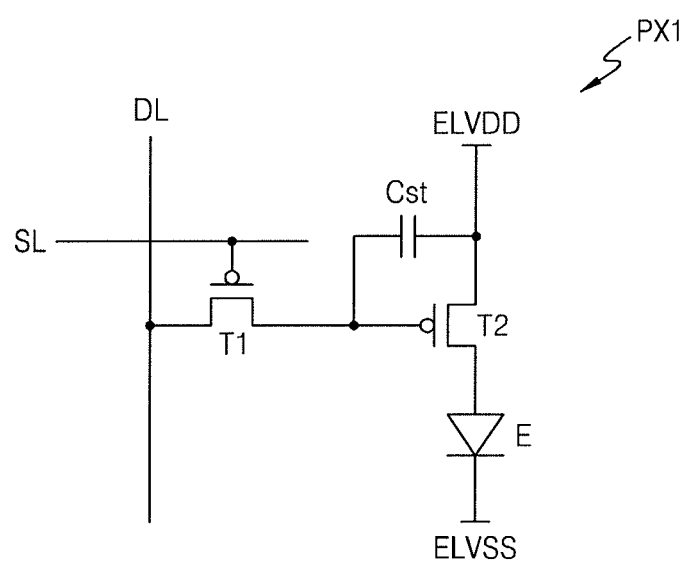
FIG. 2A illustrates an embodiment of a pixel.
Figure 2B:
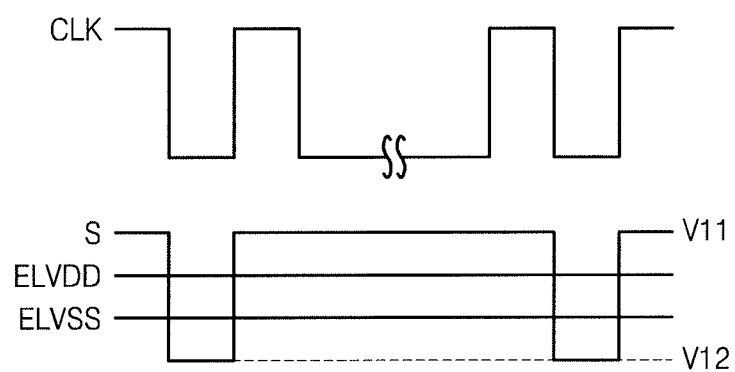
FIG. 2B illustrates an embodiment of signals for driving the pixel.

FIG. 2A illustrates an embodiment of a pixel PX1, and FIG. 2B illustrates an embodiment of signals for driving the pixel in FIG. 2A. Referring to FIGS. 2A and 2B, a display apparatus may be an organic-light emitting display apparatus, and a pixel PX1 may include a pixel circuit an emission device E connected to the pixel circuit, the pixel circuit including a first transistor T1, a second transistor T2, and a capacitor Cst.

The first transistor T1 includes a gate electrode connected to a scan line SL, a first electrode connected to a data line DL, and a second electrode. The first transistor T1 is turned ON when a scan signal S with a gate ON voltage V12 is supplied to the scan line SL and is turned OFF when a scan signal S including a gate OFF voltage V11 is supplied to the scan line SL. In the scan signal S, the gate ON voltage V12 and the gate OFF voltage V11 alternate at a certain cycle, for example, in synchronization with a pulse-type clock signal CLK. The gate ON voltage V12 may be a low-level voltage, and the gate OFF voltage V11 may be a high-level voltage.

The second transistor T2 includes a gate electrode connected to the second electrode of the first transistor T1, a first electrode that receives a first power voltage ELVDD, and a second electrode connected to the emission device E.

The capacitor Cst includes a first electrode connected to the second electrode of the first transistor T1 and the gate electrode of the second transistor T2 and a second electrode that receives the first power voltage ELVDD.

The emission device E may be connected to the pixel circuit via the second transistor T2. The emission device E may be an organic light-emitting device (OLED), which includes a first electrode connected to a second electrode of the second transistor T2, a second electrode that receives a second power voltage ELVSS, and an emission layer between the first electrode and the second electrode.

The first power voltage ELVDD may be greater than the second power voltage ELVSS. The first power voltage ELVDD may be identical to, less than, or greater than the gate OFF voltage V11. The second power voltage ELVSS may be identical to, less than, or greater than the gate ON voltage V12. FIG. 2B shows an example in which the first power voltage ELVDD is less than the gate OFF voltage V11 and the second power voltage ELVSS is greater than the gate ON voltage V12.

The first transistor T1 is turned ON when a scan signal S including the gate ON voltage V12 is supplied from the scan line SL. The first transistor T1 then transfers a data signal from the data line DL to the first electrode of the capacitor Cst. The capacitor Cst is charged with a voltage corresponding to the data signal, and a driving current corresponding to the voltage charged at the capacitor Cst is transferred to the OLED via the second transistor T2. As a result, the OLED emits light.

FIG. 2A shows an example in which each pixel includes two transistors and one capacitor. In another embodiment, each pixel may include two or more transistors and one or more capacitors. Furthermore, each pixel may have various other structures, e.g., additional wires, or one or more of the existing wire in FIG. 2A may be omitted. Also, the pixel PX1 has P-type transistors with corresponding signals applied thereto. In another embodiment, the pixel may have one or more N-type transistors with corresponding signals applied thereto, e.g., signals that are inverted relative to corresponding signals in FIG. 2B.

Figure 3A:
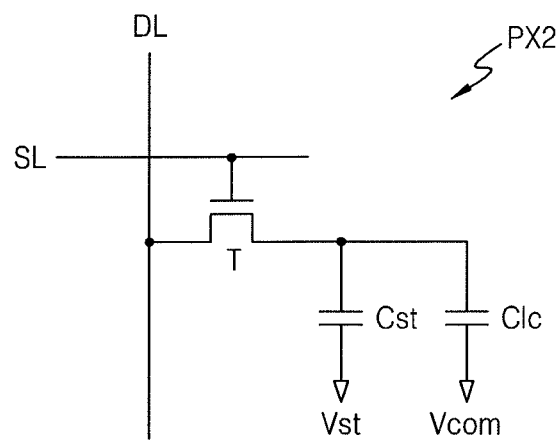
FIG. 3A illustrates another embodiment of a pixel.
Figure 3B:
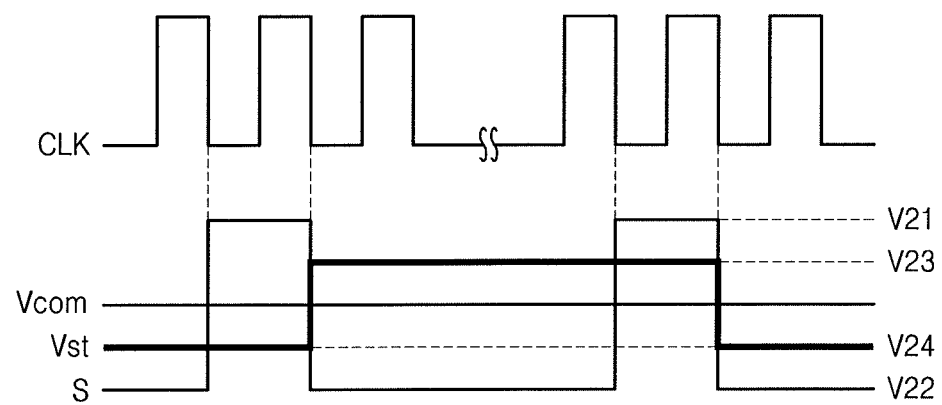
FIG. 3B illustrates an embodiment of signals for driving the pixel in FIG. 3A.

FIG. 3A illustrates another embodiment of a pixel PX2, and FIG. 3B illustrates an embodiment of signals for driving the pixel in FIG. 3A. Referring to FIGS. 3A and 3B, the display apparatus may be an LCD apparatus and pixel PX2 may include a transistor T, a liquid crystal capacitor Clc, and a storage capacitor Cst.

The transistor T includes a gate electrode connected to a scan line SL, a first electrode connected to a data line DL, and a second electrode. The transistor T is turned ON when a scan signal S including a gate ON voltage V21 is supplied to the scan line SL and is turned OFF when a scan signal S including a gate OFF voltage V22 is supplied to the scan line SL. In the scan signal S, the gate ON voltage V21 and the gate OFF voltage V22 alternate at a certain cycle, for example, in synchronization with a pulse-type clock signal CLK. The gate ON voltage V21 may be a high-level voltage, and the gate OFF voltage V22 may be a low-level voltage.

The liquid crystal capacitor Clc includes a first electrode connected to the second electrode of the transistor T, a second electrode that receives a common voltage Vcom, and a liquid crystal layer between the first electrode and the second electrode. The first electrode may be a pixel electrode on the substrate 100, ands the second electrode may be a common electrode on a counter substrate that faces the substrate 100. The common voltage Vcom may be a voltage between the gate ON voltage V21 and the gate OFF voltage V22. The common voltage Vcom may be a voltage between a high-level voltage V23 and a low-level voltage V24 of a reference voltage Vst.

The storage capacitor Cst includes a first electrode connected to the second electrode of the transistor T and a second electrode that receives the reference voltage Vst. The first electrode may be a pixel electrode on the substrate 100, and the second electrode may be a wire on the substrate 100. In the reference voltage Vst, the high-level voltage V23 and the low-level voltage V24 alternate at a certain cycle. The high-level voltage V23 of the reference voltage Vst may be identical to, less than, or greater than the gate ON voltage V21. The low-level voltage V24 of the reference voltage Vst may be identical to, less than, or greater than the gate OFF voltage V22. FIG. 3B illustrates an example in which the high-level voltage V23 of the reference voltage Vst is less than the gate ON voltage V21 and the low-level voltage V24 of the reference voltage Vst is greater than the gate OFF voltage V22.

When a scan signal S including the gate ON voltage V21 is supplied from the scan line SL, storage capacitor Cst stores a voltage corresponding to a data signal from the data line DL. Therefore, the arrangement of the liquid crystal molecules of the liquid crystal capacitor Clc changes according to the data signal transferred to the pixel electrode of the storage capacitor Cst and the common voltage Vcom applied to the second electrode, thereby adjusting the amount of transmitted light or blocking light transmission. The storage capacitor Cst is charged with a voltage corresponding to the data signal, and the charged voltage is supplied to the pixel electrode in order to continuously drive liquid crystals.

In FIG. 3A, the pixel PX2 includes N-type transistors with corresponding signals applied thereto. In another embodiment, the pixel PX2 may include one or more P-type transistors with corresponding signals applied thereto, e.g., ones which are inverted relative to the signals in FIG. 3B.

Figure 4:
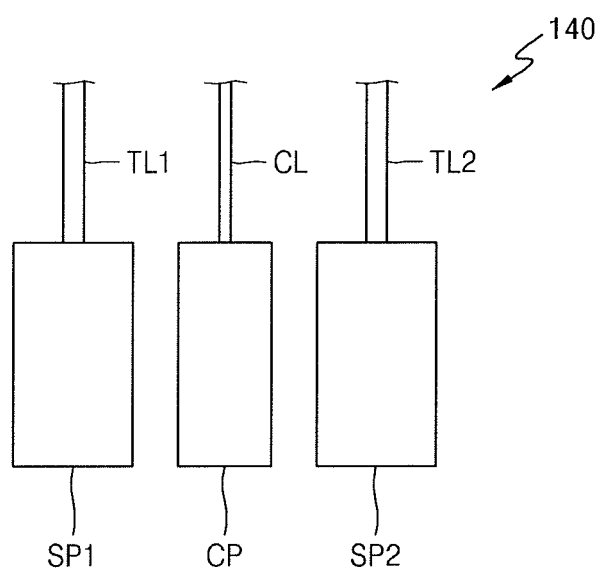
FIG. 4 illustrates an embodiment of a pad.

FIG. 4 illustrates an embodiment of the arrangement of pads 140. Referring to FIG. 4, a plurality of conductive pads and/or wires at edge portions of the non-display area NA of the substrate 100 may be corroded due to electrolysis based on voltage differences of adjacent pads and/or wires. For example, when there is a voltage difference between two metals, electrons may move from a high-voltage metal (e.g., a "+" metal) to a low-voltage metal (e.g., a "−" metal). Thus, the high-voltage metal may significantly corrode. For example, as the voltage difference between adjacent pads and/or adjacent wires increases, more electrons move. Thus, the pads and/or wires become more vulnerable to corrosion. Thus, the amount of corrosion is proportional to a voltage difference and time as shown in Equation (1).

$$\text{Amount of Corrosion} \propto \text{Voltage Difference}(V) \times \text{Time}(s) \qquad (1)$$

In an embodiment, a conductive pad CP (and/or a wire) is between a high-voltage pad (and/or a wire) and a low-voltage pad (and/or a wire) that are adjacent to each other. One or more conductive pads CP may be adjacent and parallel to one another. According to an embodiment, by applying an AC voltage or a DC voltage to the conductive pad CP, a voltage difference between adjacent pads and/or adjacent wires, or a time period during which the voltage difference is maintained, may be reduced, thereby reducing corrosion of the pads and/or wires.

Referring to FIG. 4, signal pads SP may include a first signal pad SP1 that receives a first voltage and a second signal pad SP2 that receives a second voltage. The first signal pad SP1 may transfer the first voltage to a first transfer line TL1. The second signal pad SP2 may transfer the second voltage to a second transfer line TL2. The first signal pad SP1 may be a pad to which a relatively high voltage is input, from among signal pads adjacent to each other. The second signal pad SP2 may be a pad to which a relatively low voltage is input, from among signal pads adjacent to each other.

The second voltage may be less than the first voltage. A first voltage V1 may be a high-level DC voltage (high voltage V_H). A second voltage V2 may be a low-level DC voltage (low voltage V_L). The first voltage V1 may be a positive voltage, and the second voltage V2 may be a negative voltage. For example, the high voltage V_H may be identical to or greater than +6.4 V, and the low voltage V_L may be from about −3.5 V to about −8.0 V.

The first voltage may be the high level voltage V11 of the scan signal S in FIG. 2B, the first power voltage ELVDD, the high level voltage V21 of the scan signal S, or the high-level voltage V23 of the reference voltage Vst. The second voltage may be the low level voltage V12 of the scan signal S in FIG. 2B, the second power voltage ELVSS, the low level voltage V22 of the scan signal S, or the low-level voltage V24 of the reference voltage Vst. The first voltage and/or the second voltage may be different in another embodiment, e.g., may vary according to circuit configurations of a pixel and/or a driver. For example, the second voltage may be an initializing voltage.

At least one conductive pad CP may be between the first signal pad SP1 and the second signal pad SP2. The conductive pad CP may be connected to a conductive line CL. The size of the conductive pad CP may be identical to or less than that of each of the first signal pad SP1 and the second signal pad SP2. The width of the conductive line CL may be identical to or less than that of each of the first transfer line TL1 and the second transfer line TL2. The conductive pad CP is not connected to and does not contact a flexible printed circuit board FPC bonded to the pads 140.

Figure 5A:
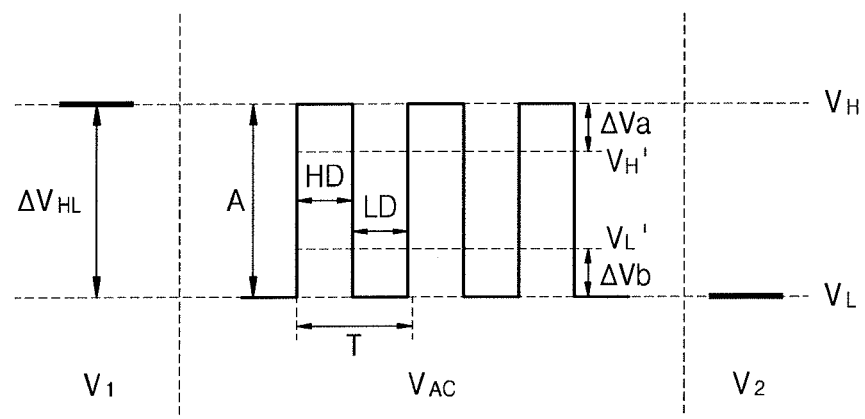
FIGS. 5A and 5B illustrate examples of waveforms of signals input to signal pads and conductive pads according to the embodiment in FIG. 4.
Figure 5B:
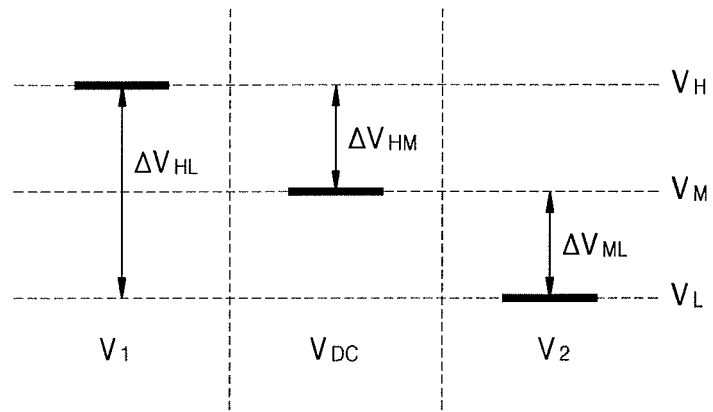

FIGS. 5A and 5B illustrate embodiments of waveforms of signals input to signal pads and conductive pads in FIG. 4. FIGS. 5A and 5B illustrate examples in which different signals are input to conductive pads, respectively.

The first signal pad SP1 may receive a first voltage V1 and transfer the first voltage V1 to the first transfer line TL1. The second signal pad SP2 may receive a second voltage V2 and transfer the second voltage V2 to the second transfer line TL2. The first voltage V1 may be the high voltage V_H, and the second voltage V2 may be the low voltage V_L. When the first signal pad SP1 and the second signal pad SP2 are directly adjacent to each other, the voltage difference between the first signal pad SP1 and the second signal pad SP2 is a difference ΔV_HL between the high voltage V_H and the low voltage V_L.

Referring to FIG. 5A, the conductive pad CP may receive a pulse-type AC voltage V_AC in which the high voltage V_H and the low voltage V_L alternate. The conductive pad CP may transfer the AC voltage V_AC to the conductive line CL. The AC voltage V_AC may have an amplitude A, a period T including a high voltage maintaining period HD and a low voltage maintaining period LD, and a frequency f.

The AC voltage V_AC may be one of a plurality of signals for driving the display apparatus 10. For example, the AC voltage V_AC may be applied to a clock line that transfers the clock signal CLK in FIG. 2B or the clock signal CLK in FIG. 3B. The AC voltage V_AC may be a signal that is newly generated by the voltage generator 180 and is different from signals for driving the display apparatus 10.

A voltage difference between the first signal pad SP1 and the conductive pad CP alternates between 0 and a difference between the high voltage V_H and the low voltage V_L (V_H−V_L=ΔV_HL). By disposing the conductive pad CP in this manner, the time period during which a voltage difference between pads adjacent to each other (e.g., the first signal pad SP1 and the conductive pad CP) occurs may be reduced to half. Therefore, the probability of corrosion of the first signal pad SP1 and the conductive pad CP may be reduced.

The voltage difference between the second signal pad SP2 and the conductive pad CP alternates between 0 and ΔV_HL. By disposing the conductive pad CP, the time period during which a voltage difference between pads adjacent to each other (the second signal pad SP2 and the conductive pad CP) occurs may be reduced to half. Therefore, the probability of corrosion of the second signal pad SP2 and the conductive pad CP may be reduced.

The voltage generator 180 may output the AC voltage V_AC to the conductive pad CP. The voltage generator 180 may control the voltage difference by adjusting the amplitude A of the AC voltage V_AC. The voltage generator 180 may adjust at least one of a high-level voltage or a low-level voltage of the AC voltage V_AC. The voltage generator 180 may change a first high voltage V_H to a second high voltage V_H', which is ΔVa lower than the first high voltage V_H, and change a first low voltage V_L to a second low voltage V_L', which is ΔVb greater than the first low voltage V_L.

For example, the AC voltage V_AC may have a waveform in which the second high voltage V_H' (which is ΔVa less than the first high voltage V_H) and the first low voltage V_L alternate. The AC voltage V_AC may also have a waveform in which the first high voltage V_H and the second low voltage V_L' (which is ΔVb greater than the first low voltage V_L) alternate. The AC voltage V_AC may also have a waveform in which the second high voltage V_H' (which is ΔVa less than the first high voltage V_H) and the second low voltage V_L' (which is ΔVb greater than the first low voltage V_L) alternate. In one embodiment, ΔVa and ΔVb may be from 0 to |(V_H−V_L)|.

The voltage generator 180 may reduce a time period during which a voltage difference occurs by adjusting at least one of the high voltage maintaining period HD or the low voltage maintaining period LD of the AC voltage V_AC. For example, the voltage generator 180 may increase the high voltage maintaining period HD of the AC voltage V_AC. In one embodiment, the AC voltage V_AC may have a waveform in which the high voltage maintaining period HD is longer than the low voltage maintaining period LD. In one embodiment, the voltage generator 180 may reduce a time period during which a voltage difference occurs by adjusting the frequency f of the AC voltage V_AC.

Referring to FIG. 5B, the conductive pad CP may receive a DC voltage V_DC and transmit the DC voltage V_DC to the conductive pad CP. The DC voltage V_DC is a middle voltage V_M between the high voltage V_H and the low voltage V_L and may be higher than the low voltage V_L and lower than the high voltage V_H (V_L<V_M<V_H).

The voltage generator 180 may output the DC voltage V_DC to the conductive pad CP. Each of the voltage difference (V_H−V_M=ΔV_HM) between the first signal pad SP1 and the conductive pad CP and the voltage difference (V_M−V_L=ΔV_ML) between the conductive pad CP and the second signal pad SP2 may be less than a voltage difference ΔV_HL between the first signal pad SP1 and the second signal pad SP2. Thus, the probability of corrosion of the first signal pad SP1, the conductive pad CP, and the second signal pad SP2 may be reduced.

Figure 6:
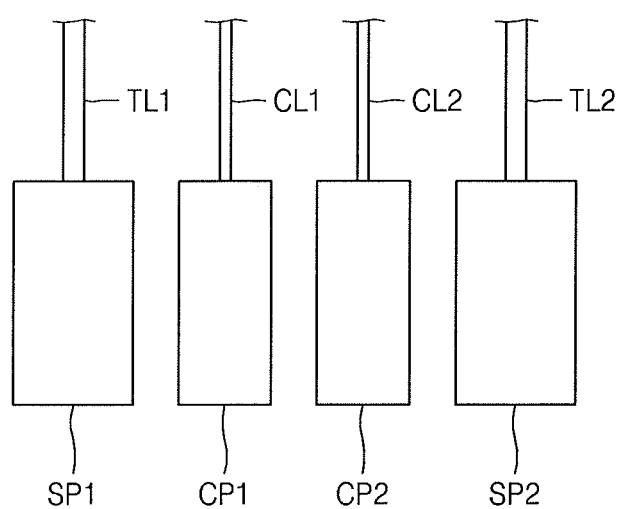
FIG. 6 illustrates another embodiment of a pad.

FIG. 6 illustrates another arrangement of pads which include two conductive pads CP1 and CP2 between the signal pads SP of the pad 140. Referring to FIG. 6, the first conductive pad CP1 and the second conductive pad CP2 may be spaced from and parallel to each other between the first signal pad SP1 and the second signal pad SP2. The first conductive pad CP1 may be adjacent to the first signal pad SP1. The second conductive pad CP2 may be adjacent to the second signal pad SP2. The first conductive pad CP1 may be connected to a first conductive line CL1, and the second conductive pad CP2 may be connected to a second conductive line CL2.

The size of each of the first conductive pad CP1 and the second conductive pad CP2 may be identical to or less than that of each of the first signal pad SP1 and the second signal pad SP2. The width of each of the first conductive line CL1 and the second conductive line CL may be identical to or less than that of each of the first transfer line TL1 and the second transfer line TL2. The first conductive pad CP1 and the second conductive pad CP2 are not connected to and do not contact a flexible printed circuit board FPC bonded to the pad 140. The remaining configuration of the pads in FIG. 6 may be identical to that of the pads in FIG. 4.

Figure 7A:
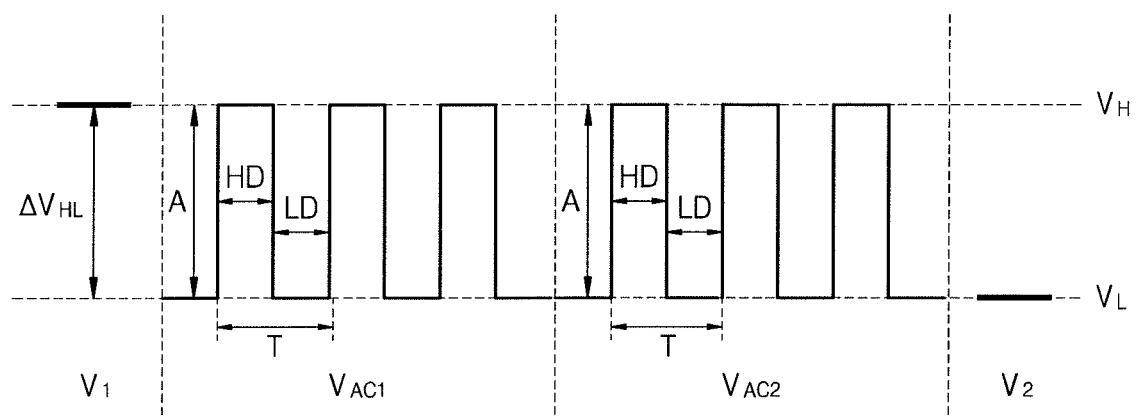
FIGS. 7A to 7D illustrate embodiments of signals input to signal pads and conductive pads according to the embodiment in FIG. 6.
Figure 7B:
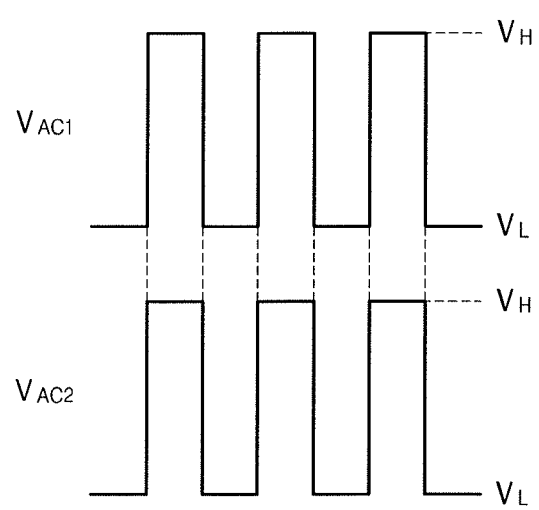
Figure 7C:
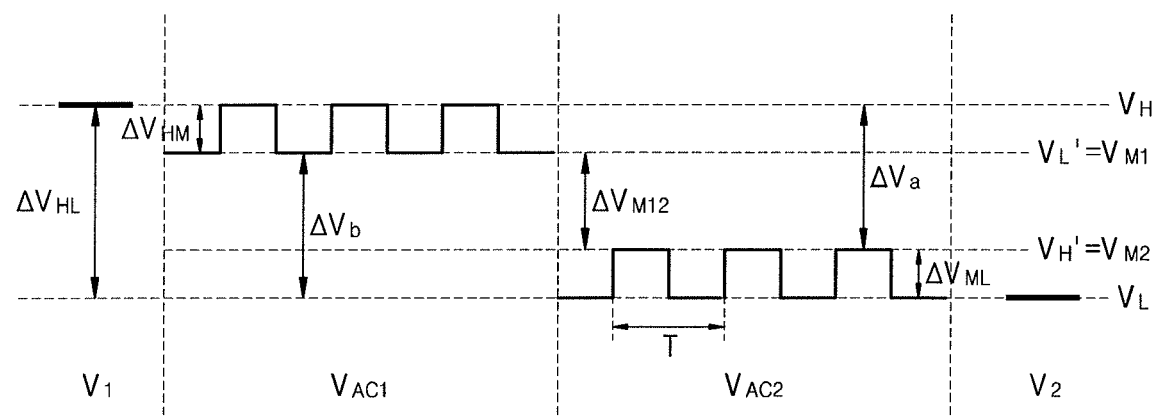
Figure 7D:
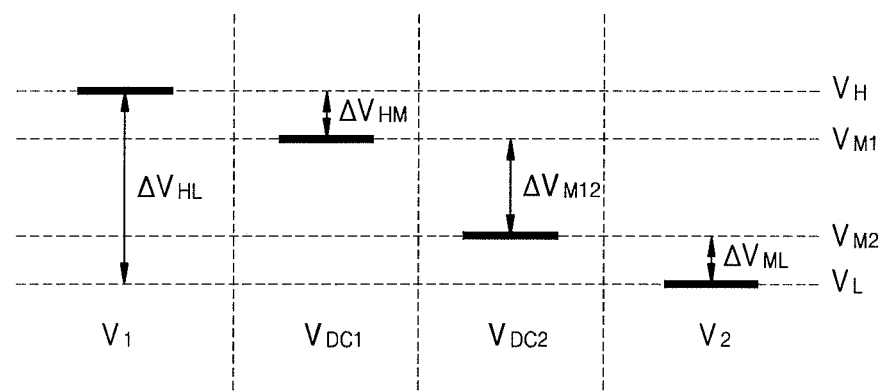

FIGS. 7A to 7D illustrates embodiments of signals input to the signal pads and conductive pads in FIG. 6. In FIGS. 7A, 7C, and 7D, different signals are input to conductive pads. The first signal pad SP1 may receive a first voltage V1 and transfer the first voltage V1 to the first transfer line TL1. The second signal pad SP2 may receive a second voltage V2 and transfer the second voltage V2 to the second transfer line TL2. The first voltage V1 may be the high voltage V_H, and the second voltage V2 may be the low voltage V_L.

When the first signal pad SP1 and the second signal pad SP2 are directly adjacent to each other, the voltage difference between the first signal pad SP1 and the second signal pad SP2 is a difference ΔV_HL between the high voltage V_H and the low voltage V_L.

Referring to FIGS. 7A and 7B, the first conductive pad CP1 may receive a pulse-type first AC voltage V_AC1 in which the high voltage V_H and the low voltage V_L alternate. The first conductive pad CP1 may transfer the first AC voltage V_AC1 to the first conductive line CL1. The second conductive pad CP2 may receive a pulse-type second AC voltage V_AC2 in which the high voltage V_H and the low voltage V_L alternate. The second conductive pad CP may transfer the second AC voltage V_AC2 to the second conductive line CL.

The first AC voltage V_AC1 and the second AC voltage V_AC2 may have an amplitude A, a period T including a high voltage maintaining period HD and a low voltage maintaining period LD, and a frequency f.

Each of the first AC voltage V_AC1 and the second AC voltage V_AC2 may be one of a plurality of signals for driving the display apparatus 10. Examples include the clock signal CLK in FIG. 2B or the clock signal CLK in FIG. 3B. The first AC voltage V_AC1 and the second AC voltage V_AC2 may be signals that are newly generated by the voltage generator 180 and are different from signals for driving display apparatus 10.

The voltage difference between the first signal pad SP1 and the first conductive pad CP1 alternates between 0 and the difference ΔV_HL. By disposing the first conductive pad CP1, a time period during which a voltage difference between adjacent pads (e.g., the first signal pad SP1 and the first conductive pad CP1) occurs may be reduced to half. Therefore, the probability of corrosion of the first signal pad SP1 and the first conductive pad CP1 may be reduced.

The voltage difference between the second signal pad SP2 and the second conductive pad CP2 alternates between 0 and the difference ΔV_HL. By disposing the second conductive pad CP2, a time period during which a voltage difference between adjacent pads (e.g., the second signal pad SP2 and the second conductive pad CP2) occurs may be reduced to half. Therefore, the probability of corrosion of the second signal pad SP2 and the second conductive pad CP2 may be reduced.

As AC voltages are respectively applied to the first conductive pad CP1 and the second conductive pad CP2, a time period during which a voltage difference between the first signal pad SP1 and the first conductive pad CP1 and a time period during which a voltage difference between second signal pad SP2 and the second conductive pad CP2 occurs may be reduced to half. Therefore, the probability of corrosion of the first signal pad SP1, the first conductive pad CP1, the second signal pad SP2, and the second conductive pad CP2 may be reduced.

The high voltage V_H and the low voltage V_L of the first AC voltage V_AC1 are identical to those of the second AC voltage V_AC2, as in FIG. 7A, and a rising time and a falling time (e.g., a period T and a frequency f) of the first AC voltage V_AC1 are identical to those of the second AC voltage V_AC2, as in FIG. 7B. Thus, there is no voltage difference between the first conductive pad CP1 and the second conductive pad CP2, and thus no corrosion may occur between the first conductive pad CP1 and the second conductive pad CP2. As a result, a short-circuit defect between the first signal pad SP1 and the second signal pad SP2 may be prevented.

The voltage generator 180 may output the first AC voltage V_AC1 and the second AC voltage V_AC2 to the first conductive pad CP1 and the second conductive pad CP2, respectively. The voltage generator 180 may adjust the voltage difference by adjusting amplitude A of at least one of the first AC voltage V_AC1 and the second AC voltage V_AC2. The voltage generator 180 may adjust at least one of the high-level voltage or the low-level voltage of at least one of the first AC voltage V_AC1 and the second AC voltage V_AC2.

Referring to FIG. 7C, the voltage generator 180 may change a first high voltage V_H to a second high voltage V_H' (which is ΔVa lower than the first high voltage V_H) and change a first low voltage V_L to a second low voltage V_L', which is ΔVb higher than the first low voltage V_L. The second low voltage V_L' may be a first intermediate voltage V_M1 that is greater than the first low voltage V_L and less than the first high voltage V_H. The second high voltage V_H' may be a second intermediate voltage V_M2 that is greater than the first low voltage V_L and less than the first high voltage V_H. The second intermediate voltage V_M2 may be identical to or less than the first intermediate voltage V_M1.

The first AC voltage V_AC1 may have a pulse-type waveform in which the first high voltage V_H and the second low voltage V_L' alternate. The first conductive pad CP1 may receive the first AC voltage V_AC1 and transfer the first AC voltage V_AC1 to the first conductive line CL1.

The second AC voltage V_AC2 may have a pulse-type waveform in which the second high voltage V_H' and the first low voltage V_L alternate. The second conductive pad CP2 may receive the second AC voltage V_AC2 and transfer the second AC voltage V_AC2 to the second conductive line CL.

The voltage difference between the first signal pad SP1 and the first conductive pad CP1 alternates between 0 and ΔV_HM. Furthermore, the voltage difference between the second signal pad SP2 and the second conductive pad CP2 alternates between 0 and ΔV_ML.

The voltage difference ΔV_HM between the first signal pad SP1 and the first conductive pad CP1, the voltage difference ΔV_M12 between the first conductive pad CP1 and the second conductive pad CP2, and the voltage difference ΔV_ML between the second signal pad SP2 and the second conductive pad CP2 may be less than the voltage difference ΔV_HL between the first signal pad SP1 and second signal pad SP2.

Furthermore, a time period during which a voltage difference ΔV_HM between the first signal pad SP1 and the first conductive pad CP1 and a time period during which a voltage difference ΔV_ML between the second signal pad SP2 and the second conductive pad CP2 occurs may be reduced to half. Therefore, the probability of corrosion of the first signal pad SP1, the first conductive pad CP1, the second signal pad SP2, and the second conductive pad CP2 may be reduced.

Furthermore, as described above in relation to FIG. 5A, the voltage generator 180 may reduce a time period during which a voltage difference occurs by adjusting at least one of the high voltage maintaining period HD or the low voltage maintaining period LD of at least one of the first AC voltage V_AC1 or the second AC voltage V_AC2. For example, the high voltage maintaining period HD of the first AC voltage V_AC1 may be different from the high voltage maintaining period HD of the second AC voltage V_AC2. The high voltage maintaining period HD of the first AC voltage V_AC1 may be longer than the high voltage maintaining period HD of the second AC voltage V_AC2.

Furthermore, the voltage generator 180 may reduce a time period during which a voltage difference occurs by adjusting the frequency f of at least one of the first AC voltage V_AC1 or the second AC voltage V_AC2. For example, the frequency f of the first AC voltage V_AC1 may be different from the frequency f of the second AC voltage V_AC2.

Referring to FIG. 7D, the first conductive pad CP1 may receive a first DC voltage V_DC1 and transfer the first DC voltage V_DC1 to the first conductive line CL1. The first DC voltage V_DC1 is a first intermediate voltage V_M1 between the high voltage V_H and the low voltage V_L and may be greater than the low voltage V_L and less than the high voltage V_H (V_L<V_M1<V_H). The second conductive pad CP2 may receive a second DC voltage V_DC2 and transfer the second DC voltage V_DC2 to the second conductive line CL2. The second DC voltage V_DC2 is a second intermediate voltage V_M2 between the high voltage V_H and the low voltage V_L and may be greater than the low voltage V_L and less than the high voltage V_H (V_L<V_M2<V_H). The second intermediate voltage V_M2 may be identical to or less than the first intermediate voltage V_M1.

The voltage generator 180 may output the first DC voltage V_DC1 to the first conductive pad CP1 and output the second DC voltage V_DC2 to the second conductive pad CP2.

The voltage difference between the first signal pad SP1 and the first conductive pad CP1 (V_H−V_M1=ΔV_HM), the voltage difference between the first conductive pad CP1 and the second conductive pad CP2 (V_M1−V_M2=ΔV_M12), and the voltage difference between the second conductive pad CP2 and the second signal pad SP2 (V_M2−V_L=ΔV_ML) may be less than the voltage difference ΔV_HL between the first signal pad SP1 and the second signal pad SP2. Therefore, the probability of corrosion of the first signal pad SP1, the first conductive pad CP1, the second conductive pad CP2, and the second signal pad SP2 may be reduced.

The voltage generator 180 may reduce size of a DC voltage, step-by-step, in a direction from a conductive pad adjacent to the first signal pad SP1 (which is a high-voltage pad) to a conductive pad adjacent to the second signal pad SP2 (which is a low-voltage pad), thereby reducing voltage differences between pads to each other step-by-step. Therefore, the probability of corrosion of signal pads and conductive pads may be reduced.

FIG. 6 shows the two conductive pads including the first conductive pad CP1 and the second conductive pad CP2. In another embodiment, one or more third conductive pads may be between the first signal pad SP1 and the second signal pad SP2. The first conductive pad CP1 and the second conductive pad CP2 may respectively receive the first AC voltage V_AC1 and the second AC voltage V_AC2 as in FIG. 7C, and the third conductive pad may receive a pulse-type AC voltage in which the high voltage V_H and the low voltage V_L alternate as in FIG. 7A.

The following table shows examples of test results regarding a relationship between input voltages and corrosion probabilities of adjacent pads.

| PAD | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|
| INPUT VOLGAGE(V) | −4.0 | +6.4 | +6.4 | +6.4 | +6.4 | +6.4 | −8.0 | −3.5 | +6.4 | AC | AC | AC | AC | AC | AC | AC | AC | AC | +6.4 |
| CORROSION PROBABILITY(%) | 0 | 100 | 20 | 10 | 70 | 100 | 20 | 20 | 100 | 10 | 0 | 0 | 0 | 0 | 0 | 0 | 0 | 0 | 0 |

Referring to the table, when a large voltage difference exists for a first pad and a second pad, the corrosion probability of the second pad (which is a relatively high-voltage pad) is relatively high. When a large voltage difference exists for a sixth pad and a seventh pad, the corrosion probability of the sixth pad (which is a relatively high-voltage pad) is relatively high. When a large voltage difference exists for an eighth pad and a ninth pad, the corrosion probability of the eighth pad (which is a relatively high-voltage pad) is relatively high.

When the second pad though the sixth pad receive the same DC voltages, corrosion may occur even without a voltage difference. However, corrosion decreases as distances from the first pad and the seventh pad increase. Corrosion does not occur at tenth through eighteenth pads which receive AC voltages. Also, corrosion does not occur at a nineteenth pad, which is a high-voltage pad adjacent to the eighteenth pad.

Thus, by interposing at least one pad that receives an AC voltage or DC voltage between a high-voltage pad and a low-voltage pad, the voltage difference between the pads and a time period during which the voltage difference is maintained may be reduced, thereby reducing corrosion of the pads.

In accordance with one or more of the aforementioned embodiments, a display apparatus may prevent corrosion occurring at pads on a substrate connected to an external integrated circuit (IC) and wires connected to the pads.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. A display apparatus, comprising:
a substrate including a pad area;
a first signal pad to receive a first voltage in the pad area of the substrate;
a second signal pad to receive a second voltage less than the first voltage in the pad area of the substrate; and
a plurality of conductive pads in the pad area of the substrate between the first signal pad and the second signal pad, each of the plurality of conductive pads to receive a respective direct current (DC) voltage in the pad area of the substrate, wherein
the plurality of conductive pads includes a first conductive pad immediately adjacent to the first signal pad and a second conductive pad immediately adjacent to the second signal pad, wherein the respective DC voltages of the plurality of conductive pads are reduced stepwise in a direction from the first conductive pad to the second conductive pad,
the first voltage of the first signal pad is higher than the DC voltage of the first conductive pad, and the second voltage of the second signal pad is lower than the DC voltage of the second conductive pad, and
the first and second signal pads are connectable to a flexible printed circuit board, and the plurality of conductive pads are not electrically connected to the flexible printed circuit board.

2. The display apparatus as claimed in claim 1, wherein the DC voltages are between the first voltage and the second voltage.

3. The display apparatus as claimed in claim 1, wherein the DC voltage of the first conductive pad is higher than the DC voltage of the second conductive pad.

4. The display apparatus as claimed in claim 1, wherein a size of each of the conductive pads is less than that of each of the first signal pad and the second signal pad.

5. The display apparatus as claimed in claim 1, further comprising:
conductive lines connected to respective conductive pads of the plurality of conductive pads.

6. The display apparatus as claimed in claim 1, further comprising:
a voltage generator to output the first voltage and the second voltage respectively to the first signal pad and the second signal pad and to output the DC voltage to the plurality of conductive pads.

7. The display apparatus as claimed in claim 1, further comprising:
a plurality of pixels on the substrate; and
a driver to output driving signals to the pixels.

8. The display apparatus as claimed in claim 7, wherein at least one of the first signal pad and the second signal pad is connected to an input line inputting a signal to the driver.

9. The display apparatus as claimed in claim 7, wherein at least one of the first signal pad and the second signal pad is connected to a power line supplying power voltages to the pixels.

10. The display apparatus as claimed in claim 1, wherein the signal pads and the conductive pads are disposed in a single line.

11. The display apparatus as claimed in claim 1, wherein the first voltage and the second voltage are supplied to the signal pads from a voltage generator located on the printed circuit board, and
the DC voltages are supplied to the respective conductive pads from a source located on the substrate.

12. The display apparatus as claimed in claim 1, wherein the respective DC voltages of the plurality of conductive pads are always reduced stepwise in the direction from the first conductive pad to the second conductive pad.

13. The display apparatus as claimed in claim 1, wherein the respective DC voltages of the plurality of conductive pads are reduced stepwise in a direction from the first signal pad to the second signal pad.

14. The display apparatus as claimed in claim 13, wherein the respective DC voltages of the plurality of conductive pads are always reduced stepwise in the direction from the first signal pad to the second signal pad.

15. The display apparatus as claimed in claim 1, wherein the first conductive pad is located close enough to the first signal pad such that the respective DC voltage of the first conductive pad as compared to the DC voltage of the first signal pad reduces a probability of corrosion of the first signal pad; and
the second conductive pad is located close enough to the second signal pad such that the respective DC voltage of the second conductive pad as compared to the DC voltage of the second signal pad reduces a probability of corrosion of the second signal pad.

* * * * *